(12) United States Patent
Iwao

(10) Patent No.: US 11,043,398 B2
(45) Date of Patent: Jun. 22, 2021

(54) SUBSTRATE PROCESSING DEVICE

(71) Applicant: SCREEN Holdings Co., Ltd., Kyoto (JP)

(72) Inventor: Michinori Iwao, Kyoto (JP)

(73) Assignee: SCREEN Holdings Co., Ltd.

( * ) Notice: Subject to any disclaimer, the term of this patent is extended or adjusted under 35 U.S.C. 154(b) by 450 days.

(21) Appl. No.: 15/510,552

(22) PCT Filed: Mar. 10, 2015

(86) PCT No.: PCT/JP2015/057020
§ 371 (c)(1),
(2) Date: Mar. 10, 2017

(87) PCT Pub. No.: WO2016/042806
PCT Pub. Date: Mar. 24, 2016

(65) Prior Publication Data
US 2017/0256426 A1   Sep. 7, 2017

(30) Foreign Application Priority Data
Sep. 18, 2014  (JP) .............................. JP2014-190106

(51) Int. Cl.
*H01L 21/67* (2006.01)
*B05C 13/02* (2006.01)
(Continued)

(52) U.S. Cl.
CPC .... *H01L 21/67051* (2013.01); *B05B 13/0242* (2013.01); *B05C 13/02* (2013.01); *H01L 21/304* (2013.01); *H01L 21/6708* (2013.01)

(58) Field of Classification Search
None
See application file for complete search history.

(56) References Cited

U.S. PATENT DOCUMENTS

| 4,224,733 A | 9/1980 | Spadea | ........................... 29/571 |
| 4,563,367 A | 1/1986 | Sherman | ......................... 427/39 |

(Continued)

FOREIGN PATENT DOCUMENTS

| JP | 3-39838 | 4/1991 |
| JP | H 10-076153 A | 3/1998 |

(Continued)

OTHER PUBLICATIONS

International Search Report dated Jun. 2, 2015 in corresponding PCT International Application No. PCT/JP2015/057020.

(Continued)

*Primary Examiner* — Sylvia MacArthur
(74) *Attorney, Agent, or Firm* — Ostrolenk Faber LLP

(57) ABSTRACT

A substrate processing apparatus includes: a circulation pipe which defines a circulation passage through which a chemical liquid within a chemical-liquid tank is circulated; a supply pipe which guides the chemical liquid from the circulation pipe to a chemical-liquid nozzle; a supply valve which is switched between an open state in which the chemical liquid flowing through the supply pipe toward the chemical-liquid nozzle is passed and a closed state in which the supply of the chemical liquid from the supply pipe to the chemical-liquid nozzle is stopped; a recovery pipe which guides the chemical liquid from a cup to the chemical-liquid tank; and a branch pipe which guides the chemical liquid within the circulation pipe to the recovery pipe.

15 Claims, 5 Drawing Sheets

(51) Int. Cl.
  B05B 13/02 (2006.01)
  B05B 15/06 (2006.01)
  H01L 21/304 (2006.01)

(56) References Cited

U.S. PATENT DOCUMENTS

| | | | | |
|---|---|---|---|---|
| 6,200,414 | B1 | 3/2001 | Hwang et al. | 156/345 |
| 6,878,303 | B2* | 4/2005 | Okamoto | H01L 21/67253 |
| | | | | 118/52 |
| 2003/0176029 | A1* | 9/2003 | Sugimoto | H01L 21/67051 |
| | | | | 438/200 |
| 2008/0053493 | A1 | 3/2008 | Kimura | 134/104.4 |
| 2008/0142051 | A1* | 6/2008 | Hashizume | H01L 21/6708 |
| | | | | 134/23 |
| 2008/0185459 | A1 | 8/2008 | An et al. | 239/267 |
| 2009/0031948 | A1 | 2/2009 | Ito | 118/52 |
| 2009/0078582 | A1* | 3/2009 | Kobayashi | C25B 1/285 |
| | | | | 205/554 |
| 2010/0108096 | A1* | 5/2010 | Minami | H01L 21/6708 |
| | | | | 134/10 |
| 2012/0074102 | A1* | 3/2012 | Magara | H01L 21/31111 |
| | | | | 216/83 |
| 2013/0269599 | A1* | 10/2013 | Lin | C30B 25/165 |
| | | | | 117/88 |
| 2014/0373882 | A1 | 12/2014 | Yoshida | 134/108 |
| 2015/0000517 | A1 | 1/2015 | Yoshihara et al. | 95/1 |
| 2015/0093906 | A1* | 4/2015 | Kobayashi | H01L 21/31111 |
| | | | | 438/748 |
| 2015/0262737 | A1* | 9/2015 | Hinode | H01L 21/67017 |
| | | | | 216/83 |
| 2015/0328668 | A1* | 11/2015 | Koyama | H01L 21/67017 |
| | | | | 134/22.12 |
| 2016/0093515 | A1* | 3/2016 | Namba | H01L 21/6708 |
| | | | | 156/345.15 |
| 2017/0014873 | A1* | 1/2017 | Higuchi | B08B 9/027 |
| 2017/0256423 | A1* | 9/2017 | Saito | H01L 21/67253 |
| 2017/0256426 | A1* | 9/2017 | Iwao | B05B 15/60 |

FOREIGN PATENT DOCUMENTS

| | | |
|---|---|---|
| JP | H 10-303164 A | 11/1998 |
| JP | 2000-133630 A | 5/2000 |
| JP | 2000-223394 A | 8/2000 |
| JP | 2007-149891 A | 6/2007 |
| JP | 2008-034593 A | 2/2008 |
| JP | 2008-130835 A | 6/2008 |
| JP | TW 200921771 | 5/2009 |
| JP | 2009-158597 A | 7/2009 |
| JP | 2009-206419 A | 9/2009 |
| JP | 2009-218405 A | 9/2009 |
| JP | 2010-040756 A | 2/2010 |
| JP | 2011-061034 A | 3/2011 |
| JP | 2013-211525 A | 10/2013 |
| KR | 1999-0080624 A | 11/1999 |

OTHER PUBLICATIONS

Written Opinion dated Jun. 2, 2015 in corresponding PCT International Application No. PCT/JP2015/057020.

* cited by examiner

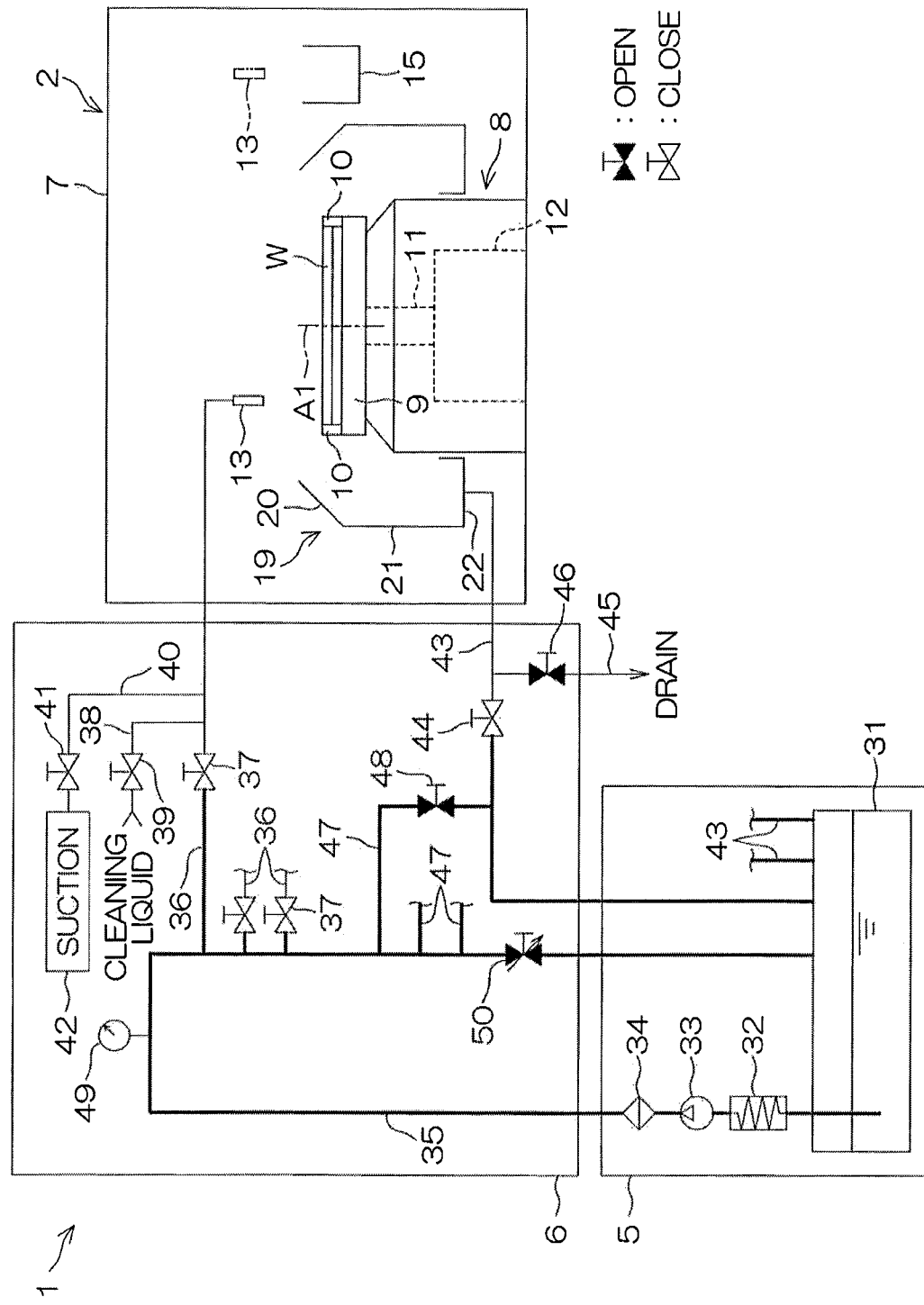
FIG. 5 ON STANDBY FOR DISCHARGE

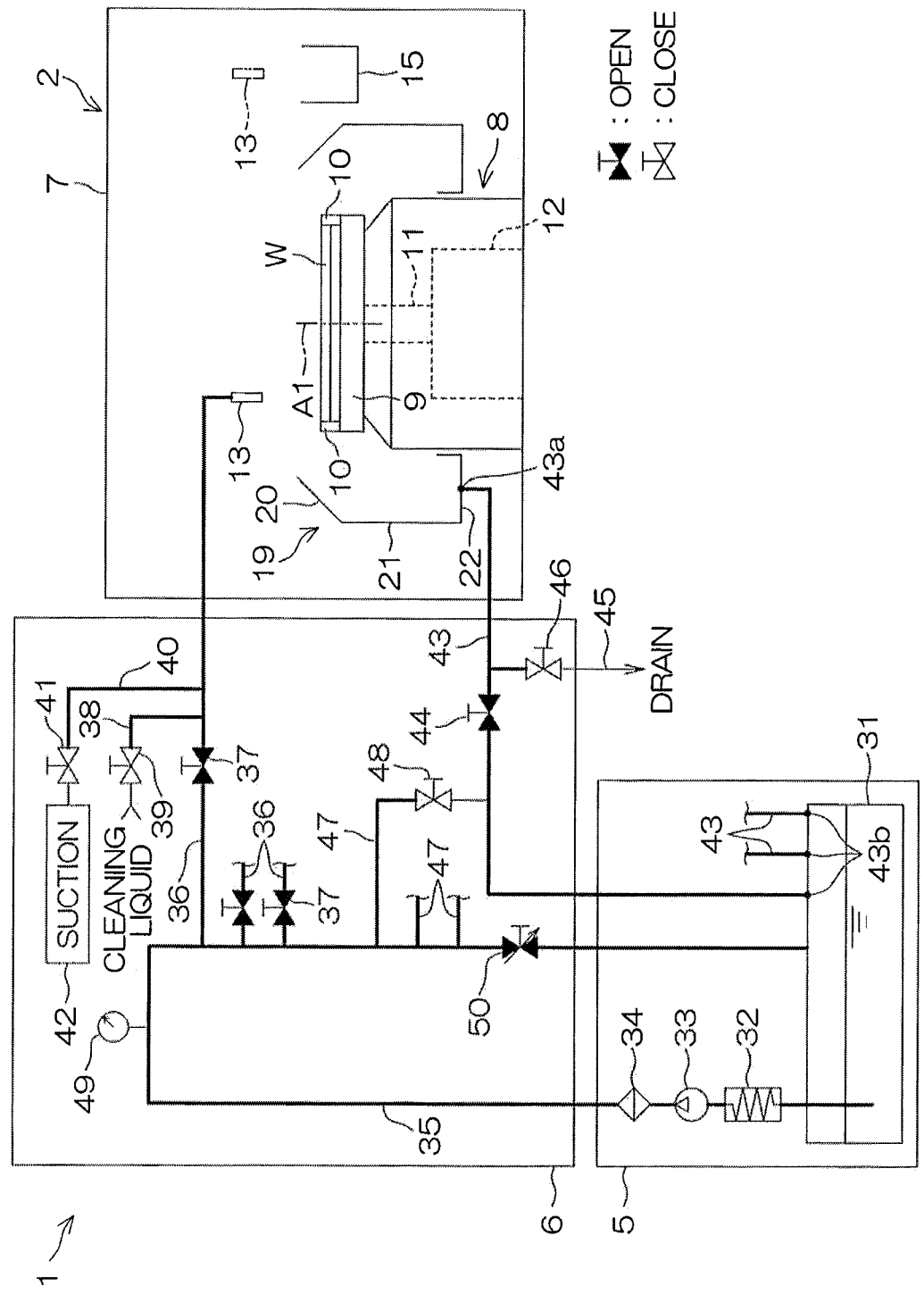
FIG. 6 DURING PERFORMANCE OF DISCHARGE

SUBSTRATE PROCESSING DEVICE

CROSS-REFERENCE TO RELATED APPLICATIONS

The present application is a 35 U.S.C. §§ 371 national phase conversion of PCT/JP2015/057020, filed Mar. 10, 2015, which claims priority to Japanese Patent Application No. 2014-190106, filed Sep. 18, 2014, the contents of both of which are incorporated herein by reference. The PCT International Application was published in the Japanese language.

TECHNICAL FIELD

The present invention relates to a substrate processing apparatus which processes a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

BACKGROUND ART

PATENT DOCUMENT 1 discloses a single substrate processing type substrate processing apparatus which processes substrates one by one. The substrate processing apparatus includes a spin chuck which holds a substrate horizontally and rotates the substrate, a chemical-liquid nozzle which discharges a chemical liquid toward an upper surface of the substrate held by the spin chuck, and a cylindrical cup which surrounds the spin chuck. The substrate processing apparatus further includes a chemical-liquid tank which stores the chemical liquid to be supplied to the chemical-liquid nozzle, a circulation pipe which defines a circulation path through which the chemical liquid within the chemical-liquid tank is circulated, and a recovery pipe which guides the chemical liquid from the cup to the chemical-liquid tank.

When the discharge of the chemical liquid from the chemical-liquid nozzle is stopped, the chemical liquid within the chemical-liquid tank is being circulated in the circulation path, and the supply of the chemical liquid to the chemical-liquid nozzle is stopped. When the discharge of the chemical liquid from the chemical-liquid nozzle is performed, the chemical liquid within the chemical-liquid tank is being supplied to the chemical-liquid nozzle. The chemical liquid supplied to the substrate is captured by the cup and is recovered by the recovery pipe into the chemical-liquid tank. When the discharge of the chemical liquid from the chemical-liquid nozzle is stopped, the supply of the chemical liquid from the cup to the recovery pipe is also stopped.

PRIOR ART DOCUMENT

Patent Document

PATENT DOCUMENT 1: JP 2011-61034 A

SUMMARY OF THE INVENTION

Problem(s) to be Solved by the Invention

In some cases, a substrate such as a semiconductor wafer is processed using a chemical liquid the concentration of which easily changes such as BHF (Buffered Hydrogen Fluoride: a mixed solution containing HF, $NH_4F$, and $H_2O$), TMAH (Tetramethylammonium Hydroxide).

When the chemical liquid is the BHF, $NH_4F$ in the BHF is dissociated into HF and $NH_3$. Hence, the concentration of $NH_4F$ in the BHF is lowered as time passes whereas the concentration of HF in the BHF is increased as time passes. When the BHF is arranged in a sealed space, since the volatilization of ammonia ($NH_3$) in the BHF is reduced, the dissociation reaction is relatively difficult to continue. On the other hand, when the BHF is arranged in an open space (space which gas can enter and exit), since the volatilization of ammonia in the BHF is promoted, the dissociation reaction is easily facilitated. In other words, when the BHF is arranged in the open space, the concentration of the BHF is relatively easily changed.

In the substrate processing apparatus of PATENT DOCUMENT 1, the chemical liquid supplied to the substrate is supplied from the cup to the recovery pipe. When the discharge of the chemical liquid from the chemical-liquid nozzle is stopped, the supply of the chemical liquid to the recovery pipe is stopped. When the discharge of the chemical liquid from the chemical-liquid nozzle is performed again, the chemical liquid supplied to the substrate is recovered into the chemical-liquid tank together with the chemical liquid left within the recovery pipe.

When the chemical liquid of PATENT DOCUMENT 1 is, for example, the BHF and the discharge of the chemical liquid is stopped for a long time, the concentration of HF in the BHF left within the recovery pipe is increased by a dissociation reaction. As the concentration of HF is increased, a crystal whose main component is HF may be precipitated. When the BHF described above is recovered into the chemical-liquid tank, the concentration of the BHF within the chemical-liquid tank is changed. Since the amount of BHF within the chemical-liquid tank is sufficiently larger than the amount of BHF left within the recovery pipe, even though only a small change in the concentration is produced, such a change in the concentration is not preferable for the processing of the substrate.

Hence, an object of the present invention is to reduce the amount of change in the concentration of the chemical liquid recovered from the substrate.

Means for Solving the Problem

A preferred embodiment of the present invention provides a substrate processing apparatus including a substrate holding unit which rotates a substrate while holding the substrate, a chemical-liquid nozzle which discharges a chemical liquid toward the substrate held by the substrate holding unit, a cylindrical processing liquid capturing unit which receives a processing liquid scattered from the substrate held by the substrate holding unit, a circulation pipe which defines a circulation path through which a chemical liquid within a chemical-liquid tank in which a chemical liquid to be supplied to the chemical-liquid nozzle is stored is circulated, a supply pipe which guides, to the chemical-liquid nozzle, the chemical liquid supplied from the chemical-liquid tank to the circulation pipe, a supply valve which is switched between an open state where the chemical liquid flowing within the supply pipe toward the chemical-liquid nozzle is passed and a closed state where the supply of the chemical liquid from the supply pipe to the chemical-liquid nozzle is stopped, a recovery pipe which guides the chemical liquid from the processing liquid capturing unit to the chemical-liquid tank, and a branch pipe which guides the chemical liquid within the circulation pipe to the recovery pipe.

In this configuration, when the supply valve is opened, the chemical liquid fed from the chemical-liquid tank to the circulation pipe is supplied through the supply pipe to the chemical-liquid nozzle and is discharged from the chemical-liquid nozzle toward the substrate held by the substrate holding unit. The chemical liquid supplied to the substrate is scattered from the substrate by the rotation of the substrate and is then received by the processing liquid capturing unit. The chemical liquid received by the processing liquid capturing unit is returned through the recovery pipe to the chemical-liquid tank. Hence, during the period in which the supply valve is open, the chemical liquid flows within the recovery pipe toward the chemical-liquid tank.

When the supply valve is closed, the supply of the chemical liquid to the chemical-liquid nozzle is stopped, and thus the supply of the chemical liquid from the processing liquid capturing unit to the recovery pipe is also stopped. The upstream end of the branch pipe is connected to the circulation pipe. Hence, even when the supply valve is closed, the chemical liquid fed from the chemical-liquid tank to the circulation pipe is supplied through the branch pipe to the recovery pipe. Therefore, even during the period in which the supply valve is closed, the chemical liquid flows within the recovery pipe toward the chemical-liquid tank.

As described above, in the present invention, regardless of whether or not the supply valve is open, the chemical liquid flows within the recovery pipe toward the chemical-liquid tank. Hence, even when the supply valve is closed for a long time, it is possible to prevent the same chemical liquid from being left in the recovery pipe for a long time. Therefore, even when a chemical liquid whose concentration is easily changed is used, a significant change in the concentration of the chemical liquid left within the recovery pipe and the precipitation of a crystal in the chemical liquid can be reduced or prevented. In this way, the recovery of a chemical liquid whose concentration has significantly changed or which contains a precipitate into the chemical-liquid tank can be reduced or prevented, with the result that the processing quality of the substrate can be further stabilized.

In the preferred embodiment described above, the substrate processing apparatus may further include a recovery valve which is switched between an open state where the chemical liquid flowing within the recovery pipe toward the chemical-liquid tank is passed and a closed state where the supply of the chemical liquid from the recovery pipe to the chemical-liquid tank is stopped.

In this configuration, when the recovery valve is closed, the flow of air from an upstream portion (portion of the recovery pipe from the upstream end of the recovery pipe to the recovery valve) of the recovery pipe to a downstream portion (a portion of the recovery pipe from the recovery valve to the downstream end of the recovery pipe) of the recovery pipe is stopped. In this way, the chemical liquid left in the downstream portion of the recovery pipe is shielded from the air floating in the upstream portion of the recovery pipe. As described above, the recovery valve is closed, and thus the degree of sealing of the downstream portion of the recovery pipe can be enhanced, with the result that it is possible to reduce a change in the concentration of the chemical liquid left in the downstream portion of the recovery pipe.

In the preferred embodiment described above, the length of the recovery pipe from the upstream end of the recovery pipe to the recovery valve may be shorter than the length of the recovery pipe from the recovery valve to the downstream end of the recovery pipe.

In this configuration, the upstream portion of the recovery pipe is shorter than the downstream portion of the recovery pipe. When the recovery valve is closed, the chemical liquid left in the downstream portion of the recovery pipe is shielded from the air floating in the upstream portion of the recovery pipe. On the other hand, the upstream portion of the recovery pipe is exposed to air which has flowed into the recovery pipe from the processing liquid capturing unit. Hence, the portion (the upstream portion of the recovery pipe) to be exposed to air is shortened, and thus it is possible to reduce a region in which a change in the concentration of the chemical liquid is easily produced.

In the preferred embodiment described above, the processing liquid capturing unit and the recovery valve may be arranged inside an outer wall of the substrate processing apparatus, and the chemical-liquid tank may be arranged outside the outer wall of the substrate processing apparatus.

In this configuration, since both the processing liquid capturing unit and the recovery valve are arranged inside the outer wall of the substrate processing apparatus, as compared with a case where the recovery valve is arranged outside the outer wall of the substrate processing apparatus, it is possible to decrease the distance between the processing liquid capturing unit and the recovery valve. Hence, the distance from the upstream end of the recovery pipe to the recovery valve can be reduced, and the portion (the upstream portion of the recovery pipe) to be exposed to air can be reduced. On the other hand, since the chemical-liquid tank is arranged outside the outer wall of the substrate processing apparatus, as compared with a case where both the chemical-liquid tank and the recovery valve are arranged inside the outer wall of the substrate processing apparatus, the distance between the chemical-liquid tank and the recovery valve can be increased. Hence, the distance from the downstream end of the recovery pipe to the recovery valve can be increased, and the portion (the downstream portion of the recovery pipe) which is sealed can be increased.

In the preferred embodiment described above, the substrate processing apparatus may further include a cleaning liquid supply unit which supplies a cleaning liquid to the processing liquid capturing unit, and a drain pipe which guides a liquid flowing downstream within the recovery pipe toward the recovery valve to outside the recovery pipe. The cleaning liquid is a liquid whose main component is water. The cleaning liquid may be pure water (deionized water) or may be an aqueous solution (for example, an aqueous solution of about 10 to 100 ppm) in which the concentration of the chemical liquid is low. The cleaning liquid supply unit includes at least one of a nozzle which discharges the cleaning liquid toward the substrate held by the substrate holding unit, a nozzle which discharges the cleaning liquid toward the substrate holding unit, and a nozzle which discharges the cleaning liquid toward the inner surface of the processing liquid capturing unit.

In this configuration, the cleaning liquid supplied by the cleaning liquid supply unit to the processing liquid capturing unit flows from the processing liquid capturing unit into the recovery pipe. When the recovery valve is closed, the cleaning liquid flowing downstream within the recovery pipe toward the recovery valve is stopped by the recovery valve. Hence, the cleaning liquid is drained from the recovery pipe to the drain pipe. The chemical liquid left in the upstream portion of the recovery pipe is drained to the drain pipe together with the cleaning liquid. In this way, the upstream portion of the recovery pipe is washed. Hence, the recovery of a chemical liquid whose concentration has significantly changed or which contains a precipitate into the chemical-liquid tank can be reduced or prevented.

In the preferred embodiment described above, the substrate processing apparatus may further include a branch valve which is switched between an open state where the chemical liquid flowing within the branch pipe toward the recovery pipe is passed and a closed state where the supply of the chemical liquid from the branch pipe to the recovery pipe is stopped.

In this configuration, when the branch valve is opened, the chemical liquid fed from the chemical-liquid tank to the circulation pipe is supplied through the branch valve from the branch pipe to the recovery pipe. On the other hand, when the branch valve is closed, the chemical liquid flowing from the circulation pipe into the branch pipe is stopped by the branch valve. Since a supply pressure of a pump or the like is applied to the chemical liquid which is supplied from the branch pipe to the recovery pipe, in a state where the chemical liquid is flowing from the branch pipe to the recovery pipe, there is a possibility that the recovery of the chemical liquid from the processing liquid capturing unit to the recovery pipe is prevented. Hence, the chemical liquid flowing within the branch pipe is temporarily stopped by the branch valve, and thus it is possible to reliably recover the chemical liquid from the processing liquid capturing unit to the recovery pipe.

In the preferred embodiment described above, the substrate processing apparatus may further include a cleaning liquid pipe which guides a cleaning liquid to a region which is downstream of the supply valve in the supply pipe. The cleaning liquid is a liquid whose main component is water.

In this configuration, when the supply valve is closed, the cleaning liquid within the cleaning liquid pipe is supplied to a downstream portion (a portion of the supply pipe from the supply valve to the downstream end of the supply pipe) of the supply pipe. The chemical liquid left in the downstream portion of the supply pipe flows to the chemical-liquid nozzle by being pushed by the cleaning liquid, and is discharged from the chemical-liquid nozzle together with the cleaning liquid. In this way, the downstream portion of the supply pipe and the chemical-liquid nozzle are washed. Hence, when the substrate is processed, the discharge of a chemical liquid whose concentration has significantly changed or which contains a precipitate from the chemical-liquid nozzle can be reduced or prevented.

In the preferred embodiment described above, the substrate processing apparatus may further include a suction pipe which transmits a suction force to a region which is downstream of the supply valve in the supply pipe.

In this configuration, the liquid left in the downstream portion of the supply pipe is sucked by the suction pipe and is removed from the downstream portion of the supply pipe. Since the suction force is transmitted through the supply pipe from the suction pipe to the chemical-liquid nozzle, the liquid left in the chemical-liquid nozzle is also sucked by the suction pipe and is removed from the chemical-liquid nozzle. In this way, the dropping of the liquid left in the downstream portion of the supply pipe and the chemical-liquid nozzle from the discharge port of the chemical-liquid nozzle and hence the adherence of the liquid to the substrate, the substrate holding unit, and the like can be reduced or prevented. When the substrate is processed, the discharge of the liquid left in the downstream portion of the supply pipe from the chemical-liquid nozzle can be reduced or prevented.

In the preferred embodiment described above, the substrate processing apparatus may include a plurality of the substrate holding units, a plurality of the chemical-liquid nozzles which correspond to the substrate holding units, respectively, a plurality of the processing liquid capturing units which correspond to the substrate holding units, respectively, a plurality of the supply pipes which correspond to the chemical-liquid nozzles, respectively, and which guide the chemical liquid within the circulation pipe to the corresponding chemical-liquid nozzles, a plurality of the supply valves which are provided in the supply pipes, respectively, a plurality of the recovery pipes which correspond to the processing liquid capturing units, respectively, and which guide the chemical liquid from the corresponding processing liquid capturing units to the chemical-liquid tank, and a plurality of the branch pipes which correspond to the recovery pipes, respectively, and which guide the chemical liquid within the circulation pipe to the corresponding recovery pipes.

In this configuration, the chemical liquid within the same chemical-liquid tank is supplied to the plurality of chemical-liquid nozzles through the circulation pipe and the plurality of supply pipes. The chemical liquid supplied to a plurality of substrates held by the plurality of substrate holding units is recovered through the plurality of processing liquid capturing units and the plurality of recovery pipes to the same chemical-liquid tank. The chemical liquid within the circulation pipe is supplied through the plurality of branch pipes to the plurality of recovery pipes. Hence, the recovery of a chemical liquid whose concentration has significantly changed or which contains a precipitate from the plurality of recovery pipes into the chemical-liquid tank can be reduced or prevented.

In the preferred embodiment described above, the substrate processing apparatus may further include a pressure gauge which measures a pressure in the circulation pipe, a pressure-regulating valve which changes the pressure in the circulation pipe and a controller which changes, based on the detection value of the pressure gauge, the opening degree of the pressure-regulating valve.

In this configuration, a plurality of supply pipes are connected to the same circulation pipe, and a plurality of supply valves are provided in the supply pipes, respectively. The liquid pressure in the circulation pipe changes according to the states of the supply valves, that is, the number of open valves, which valve is open, or the like. When the branch valve is provided in the branch pipe, the state of the branch valve also affects the liquid pressure in the circulation pipe. When the liquid pressure in the circulation pipe changes, the flow rate of the chemical liquid to be discharged from the chemical-liquid nozzle changes.

The controller determines, based on the detection value of the pressure gauge, whether or not the pressure (actual pressure) in the circulation pipe is lower than the set pressure. When the pressure in the circulation pipe is lower than the set pressure, the controller makes the pressure-regulating valve increase the pressure in the circulation pipe. Specifically, when the pressure-regulating valve is a flow rate regulating valve, the controller decreases the opening degree of the pressure-regulating valve so as to increase resistance that is applied to the chemical liquid passing through the pressure-regulating valve. Hence, on the upstream side of the pressure-regulating valve, the pressure in the circulation pipe is increased. In this way, the difference between the pressure in the circulation pipe and the set pressure is decreased, and thus the change in the flow rate of discharge is reduced or prevented.

In the preferred embodiment described above, the chemical liquid may be BHF (a mixed solution containing HF, $NH_4F$, and $H_2O$).

The above and other objects, features, and effects of the present invention will become more apparent from the following detailed description of the preferred embodiments with reference to the attached drawings.

BRIEF DESCRIPTION OF THE DRAWINGS

FIG. 5 a schematic view showing the chemical liquid supply system on standby for discharge.

FIG. 6 a schematic view showing the chemical liquid supply system during the performance of discharge.

DESCRIPTION OF PREFERRED EMBODIMENTS

Figure 1:
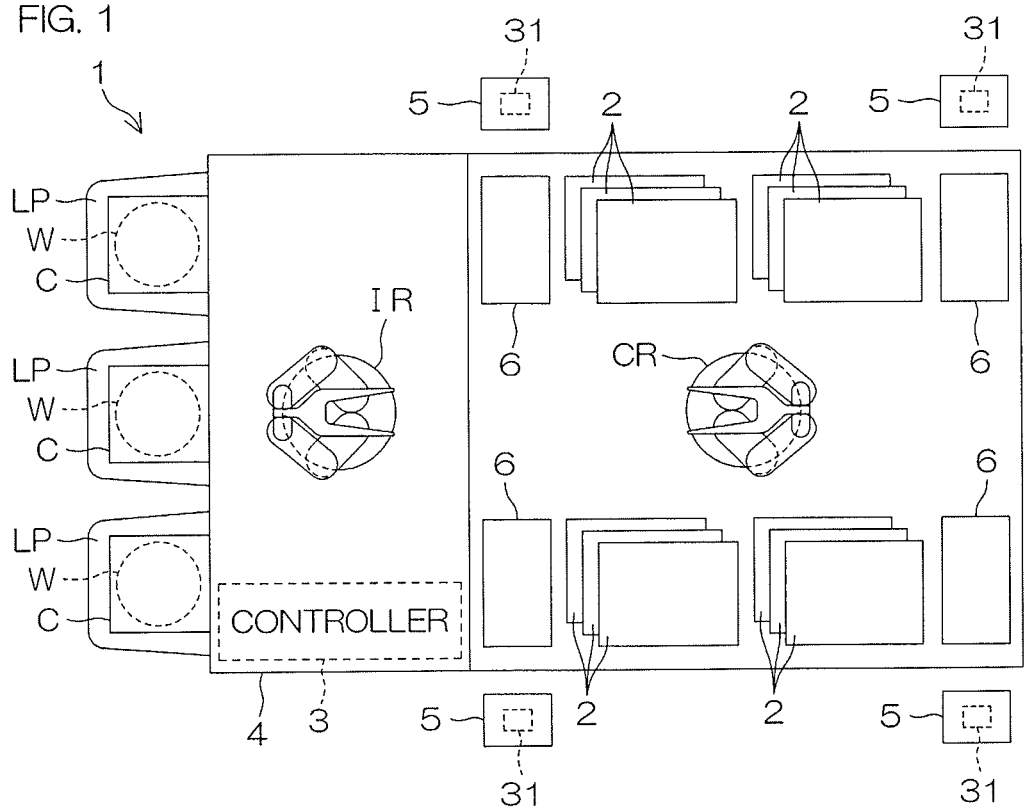
FIG. 1 a schematic view of a substrate processing apparatus according to a preferred embodiment of the present invention when viewed from above.

FIG. 1 is a schematic view of a substrate processing apparatus 1 according to a preferred embodiment of the present invention when viewed from above.

The substrate processing apparatus 1 is a single substrate processing type apparatus that processes disk-shaped substrates W, such as semiconductor wafers, one by one.

The substrate processing apparatus 1 includes a plurality of load ports LP that hold a plurality of carriers C each of which contains a substrate W, a plurality of (e.g., twelve) processing units 2 that process substrates W transferred from the plurality of load ports LP with a processing liquid such as a chemical liquid, a transfer robot that transfers substrates W from the plurality of load ports LP to the plurality of processing units 2, and a controller 3 that controls the substrate processing apparatus 1. The transfer robot includes an indexer robot IR that transfers the substrate Won a path between the load port LP and the processing unit 2, and a center robot CR that transfers the substrate W on a path between the indexer robot IR and the processing unit 2.

The substrate processing apparatus 1 includes a plurality of (four) valve boxes 6 which contain supply valves 37 which will be described below and the like. The processing units 2 and the valve boxes 6 are arranged inside an outer wall 4 of the substrate processing apparatus 1 and are covered with the outer wall 4 of the substrate processing apparatus 1. A plurality (four) of storage boxes 5 which contain chemical-liquid tanks 31 which will be described below and the like are arranged outside the outer wall 4 of the substrate processing apparatus 1. The storage boxes 5 may be arranged on the side of the substrate processing apparatus 1 or may be arranged under (in the underground of) a clean room in which the substrate processing apparatus 1 is installed.

The twelve processing units 2 form four towers disposed so as to surround the center robot CR in a plan view. Each tower includes three processing units 2 vertically stacked. The four storage boxes 5 correspond to the four towers, respectively. Similarly, the four valve boxes 6 correspond to the four towers, respectively. The chemical liquid stored in the chemical tank 31 inside the storage box 5 is supplied to three processing units 2 corresponding to this storage box 5 via the valve box 6 corresponding to this storage box 5. Also, the chemical liquid, which is supplied to substrates W at the three processing units 2 forming the same tower, is recovered into the chemical-liquid tank 31 inside the storage box 5 corresponding to this tower via the valve box 6 corresponding to this tower.

Figure 2:
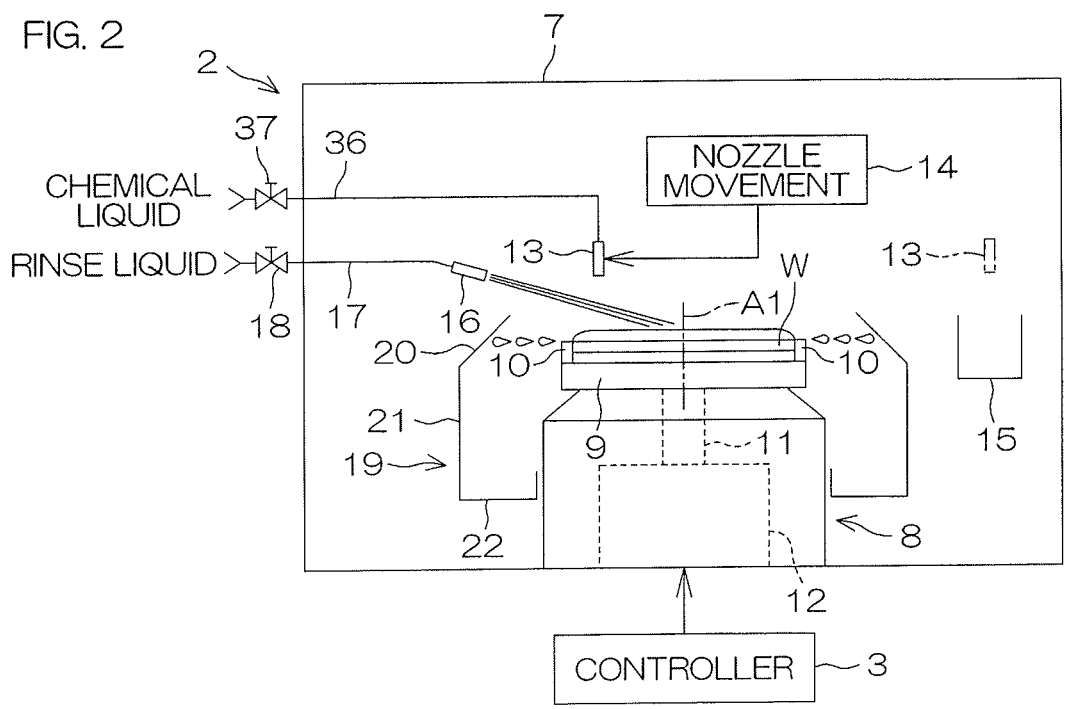
FIG. 2 a horizontal schematic view of the interior of a processing unit shown in FIG. 1.

FIG. 2 is a horizontal schematic view of the interior of the processing unit 2.

The processing unit 2 includes a box-shaped chamber 7, a spin chuck 8 that rotates the substrate W around a vertical rotational axis A1 passing through a central portion of the substrate W while holding the substrate W horizontally inside the chamber 7, a plurality of processing liquid nozzles that discharge processing liquid toward the substrate W held by the spin chuck 8, and a cylindrical cup 19 that receives the processing liquid expelled from the substrate W.

The spin chuck 8 includes a disk-shaped spin base 9 that is held in a horizontal orientation, a plurality of chuck pins 10 that hold the substrate W in a horizontal orientation above the spin base 9, a spin shaft 11 that extends downward from the central portion of the spin base 9, and a spin motor 12 that rotates the substrate W and the spin base 9 around the rotational axis A1 by rotating the spin shaft 11. The spin chuck 8 is not restricted to a clamping type chuck in which the plurality of chuck pins 10 are brought into contact with a peripheral end surface of the substrate W, and may be a vacuum type chuck in which a rear surface (lower surface) of the substrate W that is a non-device forming surface is suctioned onto an upper surface of the spin base 9 to hold the substrate W horizontally.

The processing unit 2 includes a chemical-liquid nozzle 13 which discharges the chemical liquid downward toward an upper surface of the substrate W held by the spin chuck 8, a nozzle movement unit 14 which moves the chemical-liquid nozzle 13 between a processing position (position indicated by solid lines in FIG. 2) and a retraction position (position indicated by chain double-dashed lines in FIG. 2), and a standby pot 15 which is located below the retraction position of the chemical-liquid nozzle 13 and which has a cylindrical shape with a bottom. The chemical-liquid nozzle 13 and the standby pot 15 are arranged within the chamber 7. The processing position is a position in which the chemical liquid discharged from the chemical-liquid nozzle 13 reaches the upper surface of the substrate W, and the retraction position is a position to which the chemical-liquid nozzle 13 is retracted such that the chemical-liquid nozzle 13 and the substrate W are prevented from overlapping each other in a plan view. The chemical liquid is, for example, BHF.

The processing unit 2 includes a rinse liquid nozzle 16 which discharges a rinse liquid downward toward the upper surface of the substrate W held by the spin chuck 8. The rinse liquid nozzle 16 is arranged within the chamber 7. The processing unit 2 may include a nozzle movement unit which moves the rinse liquid nozzle 16 between the processing position and the retraction position. The rinse liquid nozzle 16 is connected to a rinse liquid pipe 17 in which a rinse liquid valve 18 is interposed. When the rinse liquid valve 18 is opened, the rinse liquid is supplied from the rinse liquid pipe 17 to the rinse liquid nozzle 16 and is discharged from the rinse liquid nozzle 16. The rinse liquid is, for example, pure water (deionized water). The rinse liquid is not limited to pure water, and may be anyone of carbonated water, electrolyzed ion water, hydrogen water, ozone water, and hydrochloric acid water having a dilute concentration (for example, about 10 to 100 ppm).

The cup 19 is arranged within the chamber 7. The cup 19 includes a cylindrical inclination portion 20 which is extended obliquely upward toward the rotational axis A1, a circular cylindrical guide portion 21 which is extended downward from a lower end portion (outer end portion) of the inclination portion 20, and a liquid receiving portion 22 which defines an annular groove that is opened upward. The inclination portion 20 includes an annular upper end which has an inside diameter larger than the substrate W and the spin base 9. The upper end of the inclination portion 20 corresponds to an upper end of the cup 19. The upper end of the cup 19 surrounds the substrate W and the spin base 9 in a plan view. When the processing liquid is supplied to the substrate W, the upper end of the cup 19 is arranged higher than the substrate W. The processing liquid scattered outward from the substrate W is received by the inclination portion 20 and is thereafter collected by the guide portion 21 into the liquid receiving portion 22.

The controller 3 is a computer. When the substrate W is processed, the controller 3 makes the spin chuck 8 rotate the substrate W. Thereafter, the controller 3 makes the chemical-liquid nozzle 13 discharge the BHF which is an example of the chemical liquid toward the upper surface of the substrate W being rotated. In this way, the BHF is supplied to the entire upper surface of the substrate W (chemical liquid supply step). The BHF scattered outward from the substrate W by the rotation of the substrate W is collected to the liquid receiving portion 22.

The controller 3 stops the discharge of the BHF from the chemical-liquid nozzle 13 and then makes the rinse liquid nozzle 16 discharge the pure water which is an example of the rinse liquid toward the substrate W being rotated. In this way, the pure water is supplied to the entire upper surface of the substrate W, and thus the BHF adhered to the substrate W is washed away (rinse liquid supply step). The pure water scattered outward from the substrate W by the rotation of the substrate W is collected to the liquid receiving portion 22.

The controller 3 stops the discharge of the pure water from the rinse liquid nozzle 16 and then makes the spin chuck 8 rotate the substrate W at a high rotation speed. In this way, the pure water adhering to the substrate W is spun off by a centrifugal force. Hence, the pure water is removed from the substrate W, and thus the substrate W is dried (drying step). In this way, the substrate W is processed in each of the processing units 2.

Figure 3:
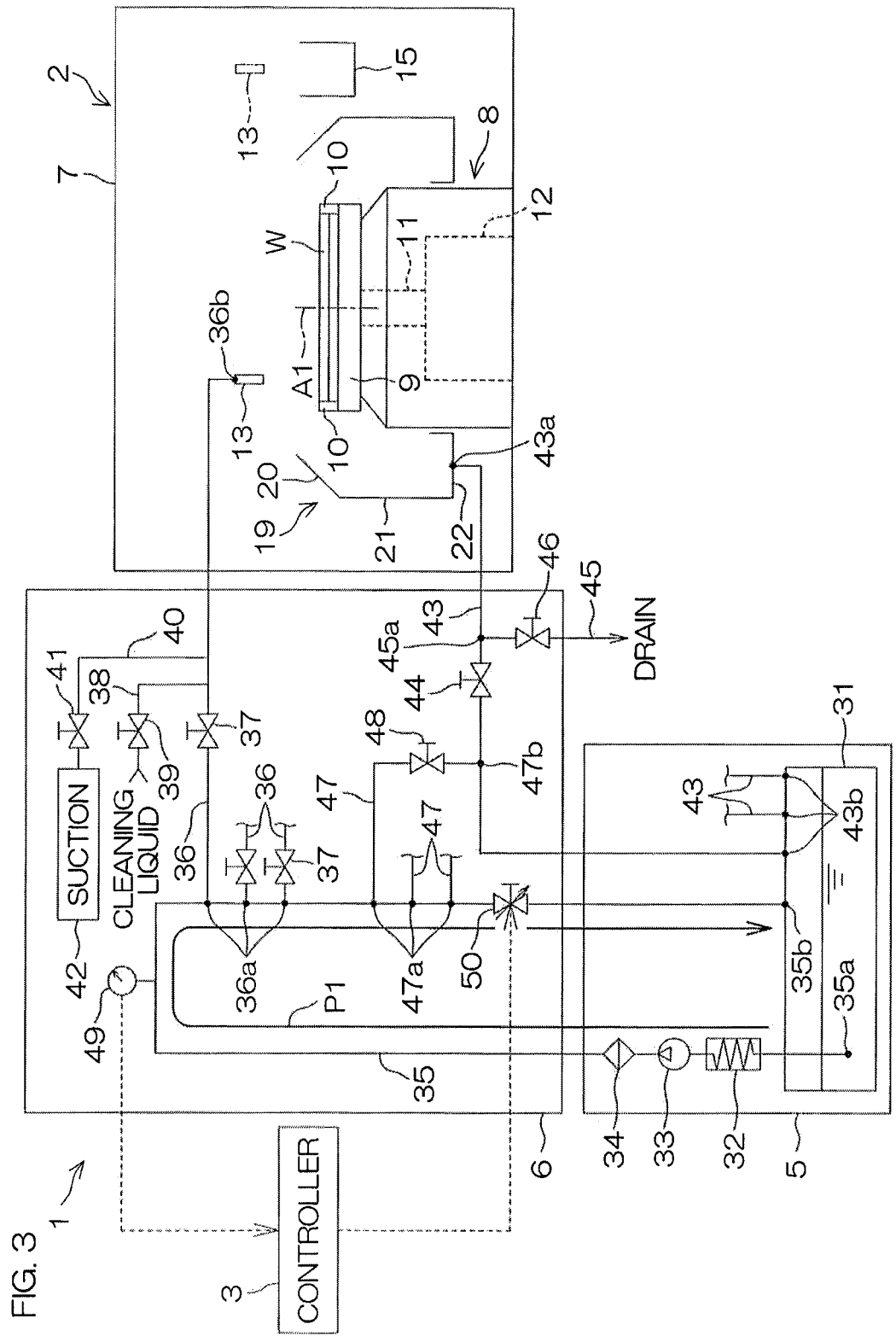
FIG. 3 a schematic view showing a chemical liquid supply system.

FIG. 3 is a schematic view showing a chemical liquid supply system.

The substrate processing apparatus 1 includes a chemical-liquid tank 31 which stores the chemical liquid to be supplied to the chemical-liquid nozzle 13, a circulation pipe 35 which defines a circulation path P1 through which the chemical liquid within the chemical-liquid tank 31 is circulated, a liquid feeding device 33 which feeds the chemical liquid within the chemical-liquid tank 31 to the circulation pipe 35, a temperature regulator 32 which regulates the temperature of the chemical liquid to be supplied from the chemical-liquid tank 31 to the chemical-liquid nozzle 13, and a filter 34 which removes foreign substances in the chemical liquid to be supplied from the chemical-liquid tank 31 to the chemical-liquid nozzle 13. The chemical-liquid tank 31, the liquid feeding device 33, the temperature regulator 32, and the filter 34 are arranged within the storage box 5.

An upstream end 35a and a downstream end 35b of the circulation pipe 35 are connected to the interior of the chemical-liquid tank 31. The circulation pipe 35 includes a supply portion which guides the chemical liquid within the chemical-liquid tank 31 to three supply pipes 36, a connection portion to which the three supply pipes 36 are connected, and a return portion which guides, to the chemical-liquid tank 31, the chemical liquid having passed through the connection portion. The temperature regulator 32 is interposed in the supply portion of the circulation pipe 35. The temperature regulator 32 may be arranged within the chemical-liquid tank 31. The temperature regulator 32 heats or cools the chemical liquid within a range of temperatures from a temperature higher than a room temperature (for example, 20° C. to 30° C.) to a temperature lower than the room temperature. The chemical liquid fed by the liquid feeding device 33 from the chemical-liquid tank 31 to the circulation pipe 35 is heated or cooled by the temperature regulator 32 and is thereafter returned to the chemical-liquid tank 31. The liquid feeding device 33 is a pump which sucks the chemical liquid within the chemical-liquid tank 31 and which discharges the sucked chemical liquid. The liquid feeding device 33 may be a pressurizing device which increases the gas pressure in the chemical-liquid tank 31 so as to feed the chemical liquid within the chemical-liquid tank 31 to the circulation pipe 35.

The substrate processing apparatus 1 includes the supply pipes 36 which guide the chemical liquid within the circulation pipe 35 to the chemical-liquid nozzle 13, the supply valves 37 which open and close the interior of the supply pipes 36, a cleaning liquid pipe 38 which supplies a cleaning liquid to the supply pipe 36, a cleaning liquid valve 39 which opens and closes the interior of the cleaning liquid pipe 38, a suction device 42 which generates a suction force, a suction pipe 40 which transmits the suction force of the suction device 42 to the interior of the supply pipe 36 and a suction valve 41 which opens and closes the interior of the suction pipe 40. The supply valves 37, the cleaning liquid valve 39, and the suction valve 41 are arranged within the valve box 6.

An upstream end 36a of the supply pipe 36 is connected to the circulation pipe 35. A downstream end 36b of the supply pipe 36 is connected to the chemical-liquid nozzle 13. The upstream ends 36a of the two other supply pipes 36 are also connected to the circulation pipe 35. The supply valves 37 are provided in the two other supply pipes 36, respectively. The three supply pipes 36 respectively correspond to the three processing units 2 which form the same tower. The temperature regulator 32 is connected to the circulation pipe 35 at a position which is upstream of the upstream ends 36a of all the supply pipes 36.

An upstream end of the cleaning liquid pipe 38 is connected to a cleaning liquid supply source. The cleaning liquid is a liquid (for example, pure water) whose main component is water. A downstream end of the cleaning liquid pipe 38 is connected to the supply pipe 36 at a position which is downstream of the supply valve 37. An upstream end of the suction pipe 40 is connected to the suction device 42. A downstream end of the suction pipe 40 is connected to the supply pipe 36 at a position which is downstream of the position of the connection of the supply pipe 36 and the cleaning liquid pipe 38.

The substrate processing apparatus 1 includes a recovery pipe 43 which guides the chemical liquid within the cup 19 to the chemical-liquid tank 31, a recovery valve 44 which opens and closes the interior of the recovery pipe 43, a drain pipe 45 which drains, from the recovery pipe 43, the liquid flowing from the cup 19 into the recovery pipe 43, a drain valve 46 which opens and closes the interior of the drain pipe 45, a branch pipe 47 which guides the chemical liquid within the circulation pipe 35 to the recovery pipe 43, and a branch valve 48 which opens and closes the interior of the branch pipe 47. The recovery valve 44, the drain valve 46, and the branch valve 48 are arranged within the valve box 6.

An upstream end 43a of the recovery pipe 43 is connected to the cup 19. A downstream end 43b of the recovery pipe 43 is connected to the interior of the chemical-liquid tank 31. The upstream ends 43a of two other recovery pipes 43 are connected to two other cups 19, respectively, and the downstream ends 43b of the two other recovery pipes 43 are connected to the interior of the same chemical-liquid tank 31. The three recovery pipes 43 respectively correspond to the three processing units 2 which form the same tower. An upstream end 45a of the drain pipe 45 is connected to the recovery pipe 43 at a position which is upstream of the recovery valve 44. A downstream end of the drain pipe 45 is connected to an unillustrated drain device.

An upstream end 47a of the branch pipe 47 is connected to the circulation pipe 35 at a position which is downstream of all the supply pipes 36. The downstream end 47b of the branch pipe 47 is connected to the recovery pipe 43 at a position which is downstream of the recovery valve 44. The upstream ends 47a of two other branch pipes 47 are connected to the circulation pipe 35 at a position which is downstream of all the supply pipes 36. The downstream ends 47b of the two other branch pipes 47 are connected to the two other recovery pipes 43 at a position which is downstream of the recovery valve 44.

The substrate processing apparatus 1 includes a pressure gauge 49 which measures the pressure in the circulation pipe 35 and a pressure-regulating valve 50 which regulates the pressure in the circulation pipe 35. The pressure gauge 49 and the pressure-regulating valve 50 are arranged within the valve box 6.

The pressure gauge 49 is connected to the circulation pipe 35 at a position which is upstream of the upstream ends 36a of all the supply pipes 36. The pressure gauge 49 measures the pressure in the circulation pipe 35 at this position. The pressure-regulating valve 50 is connected to the circulation pipe 35 at a position which is downstream of the upstream ends 47a of all the branch pipes 47. The pressure-regulating valve 50 is, for example, a flow rate regulating valve which changes the flow rate of the liquid passing through the interior thereof. The pressure gauge 49 and the pressure-regulating valve 50 are connected to the controller 3. The opening degree of the pressure-regulating valve 50 is changed by the controller 3.

As described previously, a plurality of supply pipes 36 are connected to the same circulation pipe 35, and a plurality of supply valves 37 are provided in the supply pipes 36, respectively. The liquid pressure in the circulation pipe 35 changes according to the states of the supply valves 37, that is, the number of open valves, which valve is open, or the like. Since the branch valve 48 is provided in the branch pipe 47, the state of the branch valve 48 also affects the liquid pressure in the circulation pipe 35. When the liquid pressure in the circulation pipe 35 changes, the flow rate of the chemical liquid to be discharged from the chemical-liquid nozzle 13 changes.

The controller 3 increases or decreases, based on the detection value of the pressure gauge 49, the opening degree of the pressure-regulating valve 50 such that a difference between the pressure (actual pressure) in the circulation pipe and a set pressure is decreased. Specifically, the controller 3 determines, based on the detection value of the pressure gauge 49, whether or not the pressure in the circulation pipe 35 is lower than the set pressure. When the pressure in the circulation pipe 35 is lower than the set pressure, the controller 3 decreases the opening degree of the pressure-regulating valve 50 so as to increase resistance that is applied to the chemical liquid passing through the pressure-regulating valve 50. Hence, on the upstream side of the pressure-regulating valve 50, the pressure in the circulation pipe 35 is increased. In this way, the difference between the pressure in the circulation pipe 35 and the set pressure is decreased, and thus the change in the flow rate of discharge is reduced or prevented.

Figure 4:
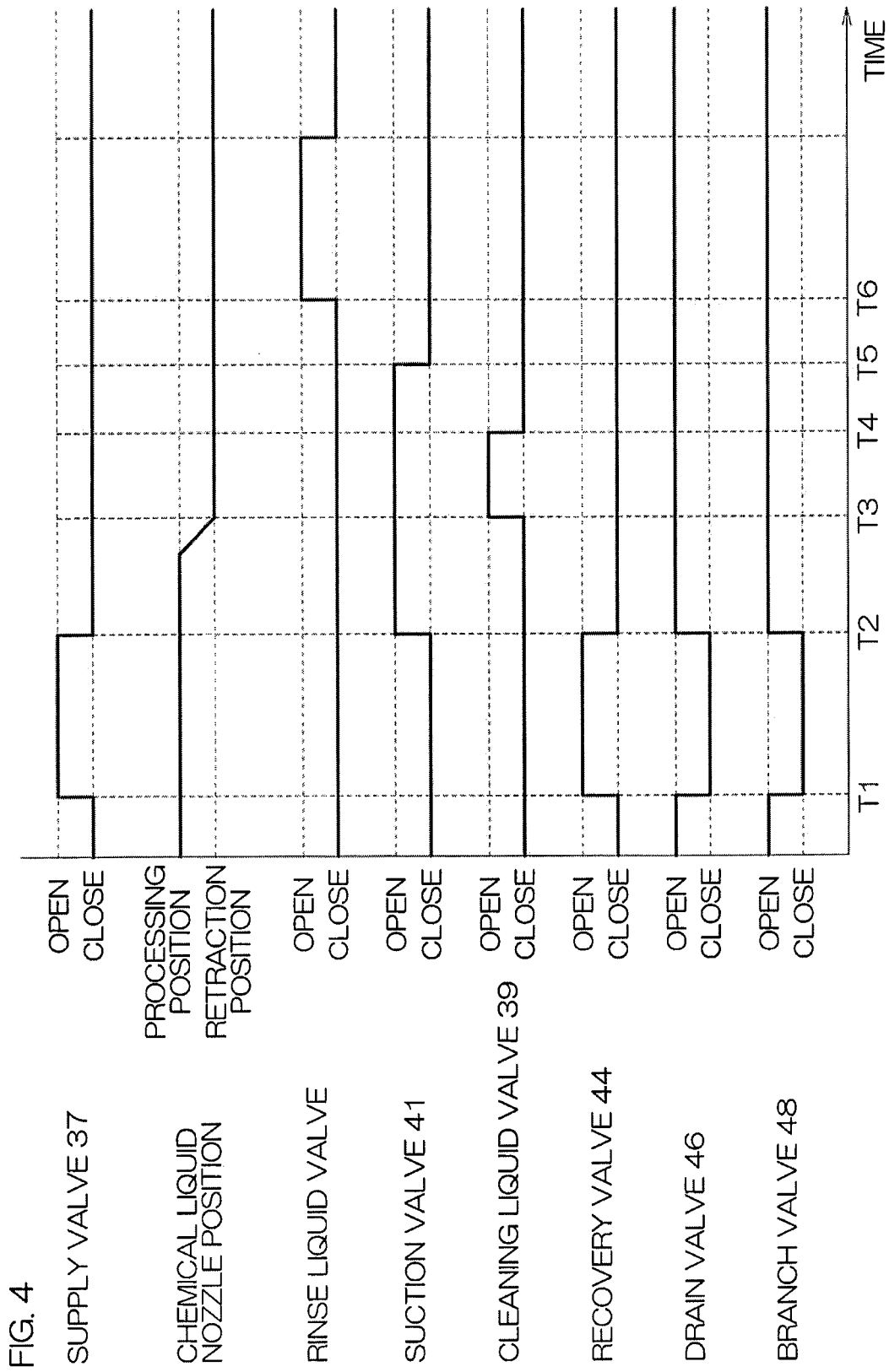
FIG. 4 a time chart at the time of transfer from on standby for discharge when the discharge of a chemical liquid from a chemical-liquid nozzle is stopped to during the performance of discharge when the chemical-liquid nozzle is discharging the chemical liquid.

FIG. 4 is a time chart at the time of transfer from on standby for discharge when the discharge of the chemical liquid from the chemical-liquid nozzle 13 is stopped to during the performance of discharge when the chemical-liquid nozzle 13 is discharging the chemical liquid. FIG. 5 is a schematic view showing the chemical liquid supply system on standby for discharge. FIG. 6 is a schematic view showing the chemical liquid supply system during the performance of discharge.

In FIGS. 5 and 6, the open valves are represented in black, and the closed valves are represented in white. In FIGS. 5 and 6, thick lines represent the presence of the chemical liquid within the pipes. FIG. 4 is shown such that operations which are performed in the same time frame are performed at the same time. For example, FIG. 4 is shown such that switching from the open state to the closed state of the drain valve 46 and switching from the open state to the closed state of the branch valve 48 are performed at time T1. However, the two types of switching do not need to be performed exactly at the same time. The same is true for the other operations.

Description will be given below with reference to FIGS. 3 and 4. FIGS. 5 and 6 will be referenced as necessary.

At the time of transfer from on standby for discharge when the discharge of the chemical liquid from the chemical-liquid nozzle 13 is stopped to during the performance of discharge when the chemical-liquid nozzle 13 is discharging the chemical liquid, in a state where the chemical-liquid nozzle 13 is located in the processing position, the supply valves 37 are opened (time T1 of FIG. 4). In this way, as shown in FIG. 6, the chemical liquid within the circulation pipe 35 is supplied through the supply pipes 36 and the supply valves 37 to the chemical-liquid nozzle 13. Hence, the BHF which is an example of the chemical liquid is discharged from the chemical-liquid nozzle 13 toward the upper surface of the substrate W being rotated (the above chemical liquid supply step). Since the branch valve 48 is closed during the period from time T1 to time T2, the chemical liquid flowing from the circulation pipe 35 into the branch pipe 47 is stopped by the branch valve 48. Hence, during the performance of discharge, the supply of the chemical liquid from the branch pipe 47 to the recovery pipe 43 is stopped.

The chemical liquid discharged from the chemical-liquid nozzle 13 reaches the upper surface of the substrate W being rotated and is then spun off outward from the substrate W. The chemical liquid drained from the substrate W is received by the cup 19 and is then expelled to the recovery pipe 43. Since the drain valve 46 is closed during the period from time T1 to time T2, as shown in FIG. 6, the chemical liquid flowing from the recovery pipe 43 into the drain pipe 45 is stopped by the drain valve 46. On the other hand, since the recovery valve 44 is open during this period, as shown in FIG. 6, the chemical liquid within the recovery pipe 43 is recovered through the recovery pipe 43 and the recovery valve 44 into the chemical-liquid tank 31. Hence, during the performance of discharge, the region from the upstream end 43a of the recovery pipe 43 to the downstream end 43b of the recovery pipe 43 is filled with the chemical liquid.

When a predetermined time has elapsed since the start of the discharge of the chemical liquid, the supply valves 37 are closed (time T2 of FIG. 4). Hence, as shown in FIG. 5, the chemical liquid flowing from the circulation pipe 35 into the supply pipes 36 is stopped by the supply valves 37. When the supply valves 37 are closed, the recovery valve 44 is closed, and the drain valve 46 and the branch valve 48 are opened. Hence, the chemical liquid flowing from the circulation pipe 35 into the branch pipe 47 flows through the branch valve 48 into the recovery pipes 43. The chemical liquid flowing into the recovery pipe 43 flows downward from the position of the connection of the branch pipe 47 and the recovery pipe 43 and returns to the chemical-liquid tank 31. Since the recovery valve 44 is closed, as shown in FIG. 5, the chemical liquid flowing back to the drain pipe 45 within the recovery pipe 43 is stopped by the recovery valve 44. Hence, on standby for discharge, a downstream portion (a portion of the recovery pipe 43 from the recovery valve 44 to the downstream end 43b of the recovery pipe 43) of the recovery pipe 43 is filled with the chemical liquid.

After the discharge of the chemical liquid is stopped, the rinse liquid valve 18 is opened (time T6 of FIG. 6). In this way, the pure water which is an example of the rinse liquid is discharged from the rinse liquid nozzle 16 toward the upper surface of the substrate W being rotated (the above rinse liquid supply step). The pure water supplied to the substrate W is received by the cup 19 and is then drained to the recovery pipe 43. Here, since the recovery valve 44 is closed, the pure water flowing into the recovery pipe 43 is stopped by the recovery valve 44. On the other hand, since the drain valve 46 is open, the pure water flowing from the recovery pipe 43 into the drain pipe 45 is drained through the drain valve 46 from the drain pipe 45. In this way, the chemical liquid left in an upstream portion (a portion of the recovery pipe 43 from the upstream end 43a of the recovery pipe 43 to the recovery valve 44) of the recovery pipe 43 is washed away by the pure water.

When the supply valves 37 are closed, the suction valve 41 is opened accordingly (time T2 of FIG. 4). In this way, the suction force of the suction device 42 is transmitted through the suction pipe 40 to the supply pipe 36. Hence, the chemical liquid left in the region from the supply valve 37 to the chemical-liquid nozzle 13 is sucked through the suction pipe 40 by the suction device 42. When a predetermined time has elapsed since the start of the drain of the chemical liquid left in the supply pipe 36 and the chemical-liquid nozzle 13, the nozzle movement unit 14 moves the chemical-liquid nozzle 13 from the processing position to the retraction position (time T3 of FIG. 4). In this way, the chemical-liquid nozzle 13 is arranged above the standby pot 15.

When the chemical-liquid nozzle 13 is arranged above the standby pot 15, the cleaning liquid valve 39 is opened (time T3 of FIG. 4). In this way, the pure water which is an example of the cleaning liquid is supplied through the cleaning liquid pipe 38 and the supply pipe 36 to the chemical-liquid nozzle 13 and is discharged from the chemical-liquid nozzle 13 toward the opening portion of the standby pot 15. Hence, the chemical liquid left in the region from the supply valve 37 to the chemical-liquid nozzle 13 is washed away by the pure water. The liquid (liquid containing at least one of the pure water and the chemical liquid) discharged from the chemical-liquid nozzle 13 is received by the standby pot 15. Since the suction valve 41 is open during the period from time T3 to time T4, the pure water within the supply pipe 36 is sucked through the suction pipe 40 by the suction device 42. In this way, the chemical liquid left within the suction pipe 40 is washed away by the pure water.

When a predetermined time has elapsed since the start of the supply of the cleaning liquid, the cleaning liquid valve 39 is closed (time T4 of FIG. 4). Thereafter, the suction valve 41 is closed (time T5 of FIG. 4). The cleaning liquid valve 39 is closed, and thus the supply of the pure water to the chemical-liquid nozzle 13, the supply pipe 36, and the suction pipe 40 is stopped. After the cleaning liquid valve 39 is closed, the suction valve 41 is closed, and thus the pure water left in the region from the supply valve 37 to the chemical-liquid nozzle 13 is sucked through the suction pipe 40 by the suction device 42. Likewise, the cleaning liquid left in the region from the cleaning liquid valve 39 to the downstream end of the cleaning liquid pipe 38 is sucked through the suction pipe 40 by the suction device 42. In this way, the pure water left in these regions is drained.

As described above, in the present preferred embodiment, when the supply valves 37 are opened, the chemical liquid fed from the chemical-liquid tank 31 to the circulation pipe 35 is supplied through the supply pipe 36 to the chemical-liquid nozzle 13 and is discharged from the chemical-liquid nozzle 13 toward the substrate W held by the spin chuck 8. The chemical liquid supplied to the substrate W is scattered from the substrate W by the rotation of the substrate W and is then received by the cup 19. The chemical liquid received by the cup 19 is returned through the recovery pipe 43 to the chemical-liquid tank 31. Hence, during the period in which the supply valves 37 are open, the chemical liquid flows within the recovery pipe 43 toward the chemical-liquid tank 31.

When the supply valves 37 are closed, the supply of the chemical liquid to the chemical-liquid nozzle 13 is stopped, and thus the supply of the chemical liquid from the cup 19 to the recovery pipe 43 is also stopped. The upstream end 47a of the branch pipe 47 is connected to the circulation pipe 35. Hence, even when the supply valves 37 are closed, the chemical liquid fed from the chemical-liquid tank 31 to the circulation pipe 35 is supplied through the branch pipe 47 to the recovery pipe 43. Therefore, even during the period in which the supply valves 37 are closed, the chemical liquid flows within the recovery pipe 43 toward the chemical-liquid tank 31.

As described above, in the present preferred embodiment, regardless of whether or not the supply valves 37 are open, the chemical liquid flows within the recovery pipe 43 toward the chemical-liquid tank 31. Hence, even when the supply valves 37 are closed for a long time, it is possible to prevent the same chemical liquid from being left in the recovery pipe 43 for a long time. Therefore, even when a chemical liquid whose concentration is easily changed is used, a significant change in the concentration of the chemical liquid left within the recovery pipe 43 and the precipitation of a crystal in the chemical liquid can be reduced or prevented. In this way, the recovery of a chemical liquid whose concentration has significantly changed or which contains a precipitate into the chemical-liquid tank 31 can be reduced or prevented, with the result that the processing quality of the substrate W can be further stabilized.

In the present preferred embodiment, when the recovery valve 44 is closed, the flow of air from an upstream portion (a portion of the recovery pipe 43 from the upstream end 43a of the recovery pipe 43 to the recovery valve 44) of the recovery pipe 43 to the downstream portion (a portion of the recovery pipe 43 from the recovery valve 44 to the downstream end 43b of the recovery pipe 43) of the recovery pipe 43 is shielded. In this way, the chemical liquid left in the downstream portion of the recovery pipe 43 is shielded from the air floating in the upstream portion of the recovery pipe 43. As described above, the recovery valve 44 is closed, and thus the degree of sealing of the downstream portion of the recovery pipe 43 can be enhanced, with the result that it is possible to reduce a change in the concentration of the chemical liquid left in the downstream portion of the recovery pipe 43.

In the present preferred embodiment, the upstream portion of the recovery pipe 43 is shorter than the downstream portion of the recovery pipe 43. When the recovery valve 44 is closed, the chemical liquid left in the downstream portion of the recovery pipe 43 is shielded from the air floating in the upstream portion of the recovery pipe 43. On the other hand, the upstream portion of the recovery pipe 43 is exposed to air which has flowed into the recovery pipe 43 from the cup 19. Hence, the portion (the upstream portion of the recovery pipe 43) to be exposed to air is shortened, and thus it is possible to reduce a region in which a change in the concentration of the chemical liquid is easily produced.

In the present preferred embodiment, since both the cup 19 and the recovery valve 44 are arranged inside the outer wall 4 of the substrate processing apparatus 1, as compared with a case where the recovery valve 44 is arranged outside the outer wall 4 of the substrate processing apparatus 1, it is possible to decrease the distance between the cup 19 and the recovery valve 44. Hence, the distance from the upstream end 43a of the recovery pipe 43 to the recovery valve 44 can be reduced, and the portion (the upstream portion of the recovery pipe 43) to be exposed to the air can be reduced. On the other hand, since the chemical-liquid tank 31 is arranged outside the outer wall 4 of the substrate processing apparatus 1, as compared with a case where both the chemical-liquid tank 31 and the recovery valve 44 are arranged inside the outer wall 4 of the substrate processing apparatus 1, the distance between the chemical-liquid tank 31 and the recovery valve 44 can be increased. Hence, the distance from the downstream end 43b of the recovery pipe 43 to the recovery valve 44 can be increased, and the portion (the downstream portion of the recovery pipe 43) which is sealed can be increased.

In the present preferred embodiment, the rinse liquid nozzle 16, which is an example of a cleaning liquid supply nozzle, discharges the pure water which is an example of the cleaning liquid, and the discharged pure water is supplied to the substrate W from the rinse liquid nozzle 16 to the cup 19. The pure water supplied by the rinse liquid nozzle 16 to the cup 19 flows from the cup 19 into the recovery pipe 43. When the recovery valve 44 is closed and the drain valve 46 is open, the pure water flowing downstream within the recovery pipe 43 toward the recovery valve 44 is stopped by the recovery valve 44. Hence, the pure water is drained from the recovery pipe 43 to the drain pipe 45. The chemical liquid left in the upstream portion of the recovery pipe 43 is drained to the drain pipe 45 together with the pure water. In this way, the upstream portion of the recovery pipe 43 is washed. Hence, the recovery of a chemical liquid whose concentration has significantly changed or which contains a precipitate into the chemical-liquid tank 31 can be reduced or prevented.

In the present preferred embodiment, when the branch valve 48 is opened, the chemical liquid fed from the chemical-liquid tank 31 to the circulation pipe 35 is supplied through the branch valve 48 from the branch pipe 47 to the recovery pipe 43. On the other hand, when the branch valve 48 is closed, the chemical liquid flowing from the circulation pipe 35 into the branch pipe 47 is stopped by the branch pipe valve 48. Since a supply pressure of the liquid feeding device 33 is applied to the chemical liquid which is supplied from the branch pipe 47 to the recovery pipe 43, in a state where the chemical liquid is flowing from the branch pipe 47 to the recovery pipe 43, there is a possibility that the recovery of the chemical liquid from the cup 19 to the recovery pipe 43 is prevented. Hence, the chemical liquid flowing within the branch pipe 47 is temporarily stopped by the branch valve 48, and thus it is possible to reliably recover the chemical liquid from the cup 19 to the recovery pipe 43.

In the present preferred embodiment, when the supply valves 37 are closed, the pure water which is an example of the cleaning liquid is supplied from the cleaning liquid pipe 38 to a downstream portion (a portion of the supply pipe 36 from the supply valve 37 to the downstream end 36b of the supply pipe 36) of the supply pipe 36. The chemical liquid left in the downstream portion of the supply pipe 36 flows to the chemical-liquid nozzle 13 by being pushed by the pure water, and is discharged from the chemical-liquid nozzle 13 together with the pure water. In this way, the downstream portion of the supply pipe 36 and the chemical-liquid nozzle 13 are washed. Hence, when the substrate W is processed, the discharge of a chemical liquid whose concentration has significantly changed or which contains a precipitate from the chemical-liquid nozzle 13 can be reduced or prevented.

In the present preferred embodiment, the liquid left in the downstream portion of the supply pipe 36 is sucked by the suction pipe 40 and is removed from the downstream portion of the supply pipe 36. Since the suction force is transmitted through the supply pipe 36 from the suction pipe 40 to the chemical-liquid nozzle 13, the liquid left in the chemical-liquid nozzle 13 is also sucked by the suction pipe 40 and is removed from the chemical-liquid nozzle 13. In this way, the dropping of the liquid left in the downstream portion of the supply pipe 36 and the chemical-liquid nozzle 13 from the discharge port of the chemical-liquid nozzle 13 and hence the adherence of the liquid to the substrate W, the spin chuck 8, and the like can be reduced or prevented.

In the present preferred embodiment, the chemical liquid within the same chemical-liquid tank 31 is supplied to the plurality of chemical-liquid nozzles 13 through the circulation pipe 35 and the plurality of supply pipes 36. The chemical liquid supplied to a plurality of substrates W held by the plurality of spin chucks 8 is recovered through the plurality of cups 19 and the plurality of recovery pipes 43 to the same chemical-liquid tank 31. The chemical liquid within the circulation pipe 35 is supplied through the plurality of branch pipes 47 to the plurality of recovery pipes 43. Hence, the recovery of a chemical liquid whose concentration has significantly changed or which contains a precipitate from the plurality of recovery pipes 43 into the chemical-liquid tank 31 can be reduced or prevented.

In the present preferred embodiment, since the chemical liquid whose temperature is regulated constantly flows within the recovery pipe 43, the temperature of the recovery pipe 43 is maintained to be substantially equal to the temperature of the chemical liquid recovered from the substrate W. Hence, the amount of change in the temperature of the chemical liquid within the recovery pipe 43 can be reduced. In this way, the difference between the temperature of the chemical liquid within the chemical-liquid tank 31 and the temperature of the chemical liquid recovered into the chemical-liquid tank 31 can be reduced. Thus, the amount of change in the temperature of the chemical liquid within the chemical-liquid tank 31 can be reduced. Depending on the chemical liquid, a precipitate may be produced by lowering of the temperature. However, in the present preferred embodiment, since the lowering of the temperature of the recovery pipe 43 is reduced, a precipitate is prevented from being produced from the chemical liquid.

Although the preferred embodiments of the present invention have been described above, the present invention is not restricted to the contents of the above-described preferred embodiments and various modifications are possible within the scope of the present invention.

For example, although in the preferred embodiment described above, the case where the upstream portion of the recovery pipe 43 is shorter than the downstream portion of the recovery pipe 43 is described, the length of the upstream portion of the recovery pipe 43 may be equal to or longer than the length of the downstream portion of the recovery pipe 43.

In the preferred embodiment described above, the case where the valve box 6 containing the recovery valve 44 and the like is arranged inside the outer wall 4 of the substrate processing apparatus 1 and where the storage box 5 containing the chemical-liquid tank 31 and the like is arranged outside the outer wall 4 of the substrate processing apparatus 1 is described. However, the valve box 6 may be arranged outside the outer wall 4 of the substrate processing apparatus 1. The storage box 5 may be arranged inside the outer wall 4 of the substrate processing apparatus 1.

Although in the preferred embodiment described above, the case where the upstream portion of the recovery pipe 43 is washed with the rinse liquid discharged from the rinse liquid nozzle 16 toward the substrate W held by the spin chuck 8 is described, the upstream portion of the recovery pipe 43 may be washed with the pure water used when the interior of the chamber 7 is washed. In this case, the pure water discharged from the cleaning liquid nozzle toward the upper surface of the spin base 9 being rotated may be supplied through the cup 19 to the upstream portion of the recovery pipe 43 or the pure water discharged from the cleaning liquid nozzle toward an inner surface of the cup 19 may be supplied to the upstream portion of the recovery pipe 43.

Although in the preferred embodiment described above, the case where the drain pipe 45 is connected to the recovery pipe 43 is described, when a plurality of liquid receiving portions 22 are provided in the cup 19, and the processing liquid scattered from the substrate W is collected to a different one of the liquid receiving portions 22 according to the type of processing liquid, the drain pipe 45 does not need to be connected to the recovery pipe 43.

Although in the preferred embodiment described above, the case where the cleaning liquid pipe 38 is connected to the supply pipe 36 is described, the cleaning liquid pipe 38 may be omitted. Although the case where the branch valve 48 is interposed in the branch pipe 47 is described, the branch valve 48 may be omitted. In other words, the chemical liquid within the circulation pipe 35 may be constantly supplied through the branch pipe 47 to the recovery pipe 43.

Although in the preferred embodiment described above, the case where the chemical liquid within the one chemical-liquid tank 31 is supplied to a plurality of processing units 2 is described, the chemical liquid within the one chemical-liquid tank 31 may be supplied to only one processing unit 2. In this case, the pressure gauge 49 and the pressure-regulating valve 50 may be omitted.

Although in the preferred embodiment described above, the case where the supply valve 37 is interposed in the supply pipe 36 and where the cleaning liquid valve 39 is interposed in the cleaning liquid pipe 38 is described, instead of the supply valve 37 and the cleaning liquid valve 39, a three-way valve may be arranged in the position of the connection of the supply pipe 36 and the cleaning liquid pipe 38. Likewise, instead of two valves which are interposed in two pipes connected to each other, a three-way valve may be may be arranged in the position of the connection of the two pipes. For example, instead of the recovery valve 44 and the drain valve 46, a three-way valve may be arranged in the position of the connection of the recovery pipe 43 and the drain pipe 45.

Although in the preferred embodiment described above, the case where the downstream ends 43b of the three recovery pipes 43 are connected to the same chemical-liquid tank 31 is described, the downstream end 43b of one recovery pipe 43 may be connected to chemical-liquid tank 31, and the downstream ends 43b of the remaining two recovery pipes 43 may be connected to the one recovery pipe 43. In other words, the three recovery pipes 43 may be individually connected to the same chemical-liquid tank 31 or may be collected in a position which is upstream of the chemical-liquid tank 31.

Although in the preferred embodiment described above, the case where, as shown in FIG. 4, the suction valve 41 is open from time T2 to time T5 is described, the suction valve 41 may be temporarily closed before the chemical-liquid nozzle 13 reaches the retraction position, and the suction valve 41 may be opened again before the cleaning liquid valve 39 is closed at time T4.

Although in the preferred embodiment described above, the case where the BHF is supplied to the chemical-liquid nozzle 13 is described, another chemical liquid such as TMAH may be supplied to the chemical-liquid nozzle 13.

The case where the substrate processing apparatus 1 is an apparatus that processes a disk-shaped substrate is described above, however, the substrate processing apparatus 1 may be an apparatus that processes a polygonal substrate.

Two or more of all the elements described above may be combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The present invention corresponds to Japanese Patent Application No. 2014-190106 filed on Sep. 18, 2014 in the Japan Patent Office, and the entire disclosure of this application is incorporated herein by reference.

DESCRIPTION OF THE REFERENCE NUMERALS

1: substrate processing apparatus
2: processing unit
3: controller
4: outer wall
8: spin chuck (substrate holding unit)
13: chemical-liquid nozzle
16: rinse liquid nozzle (cleaning liquid supply unit)
19: cup (processing liquid capturing unit)
31: chemical-liquid tank 32: temperature regulator
33: liquid feeding device
34: filter
35: circulation pipe
36: supply pipe
37: supply valve
38: cleaning liquid pipe
39: cleaning liquid valve
40: suction pipe
41: suction valve
42: suction device
43: recovery pipe
44: recovery valve
45: drain pipe
46: drain valve
47: branch pipe
48: branch valve
49: pressure gauge
50: pressure-regulating valve
P1: circulation path
W: substrate

What is claimed is:

1. A substrate processing apparatus comprising:
a substrate holder which rotates a substrate while holding the substrate;
a chemical-liquid nozzle which discharges a chemical liquid toward the substrate held by the substrate holder;
a cylindrical cup which receives a processing liquid scattered from the substrate held by the substrate holder;
a circulation pipe which defines a circulation path through which a chemical liquid within a chemical-liquid tank in which a chemical liquid to be supplied to the chemical-liquid nozzle is stored is circulated, wherein a downstream end of the circulation pipe is directly connected to the chemical-liquid tank;
a supply pipe which guides, to the chemical-liquid nozzle, the chemical liquid supplied from the chemical-liquid tank to the circulation pipe;
a supply valve which is switched between an open state where the chemical liquid flowing within the supply pipe toward the chemical-liquid nozzle is passed and a closed state where the supply of the chemical liquid from the supply pipe to the chemical-liquid nozzle is stopped;
a recovery pipe which guides the chemical liquid from the cup to the chemical-liquid tank, wherein flow of the chemical liquid in the recovery pipe is independent of the circulation pipe;
a recovery valve which is switched between an open state where the chemical liquid flowing within the recovery pipe toward the chemical-liquid tank is passed and a closed state where the supply of the chemical liquid from the recovery pipe to the chemical-liquid tank is stopped;
a branch pipe which is connected to the circulation pipe and the recovery pipe and guides the chemical liquid within the circulation pipe to the recovery pipe;
wherein the circulation pipe is so configured that the chemical liquid flowing into the circulation pipe from the chemical-liquid tank is capable of being returned to the chemical-liquid tank via the downstream end of the circulation pipe, without having flowed through any of the supply pipe, the branch pipe and the recovery pipe;
a branch valve which is switched between an open state where the chemical liquid flowing within the branch pipe toward the recovery pipe is passed and a closed state where the supply of the chemical liquid from the branch pipe to the recovery pipe is stopped;
a drain pipe which guides a liquid flowing downstream within the recovery pipe toward the recovery valve to outside the recovery pipe;
a drain valve which opens and closes an interior of the drain pipe; and
a cleaning liquid supply which supplies a cleaning liquid to the cup via the substrate held by the substrate holder when the supply valve and the recovery valve are closed and the branch valve and the drain valve are open.

2. The substrate processing apparatus according to claim 1,
wherein a length of the recovery pipe from an upstream end of the recovery pipe to the recovery valve is shorter than a length of the recovery pipe from the recovery valve to a downstream end of the recovery pipe.

3. The substrate processing apparatus according to claim 2,
wherein the cup and the recovery valve are arranged inside an outer wall of the substrate processing apparatus, and
the chemical-liquid tank is arranged outside the outer wall of the substrate processing apparatus.

4. The substrate processing apparatus according to claim 1 further comprising:
a cleaning liquid pipe which guides a cleaning liquid to a region which is downstream of the supply valve in the supply pipe.

5. The substrate processing apparatus according to claim 1 further comprising:
a suction pipe which transmits a suction force to a region which is downstream of the supply valve in the supply pipe.

6. The substrate processing apparatus according to claim 1 comprising:
a plurality of the substrate holders;
a plurality of the chemical-liquid nozzles which correspond to the substrate holders, respectively;
a plurality of the cups which correspond to the substrate holders, respectively;
a plurality of the supply pipes which correspond to the chemical-liquid nozzles, respectively, and which guide the chemical liquid within the circulation pipe to the corresponding chemical-liquid nozzles;
a plurality of the supply valves which are provided in the supply pipes, respectively;
a plurality of the recovery pipes which correspond to the cups, respectively, and which guide the chemical liquid from the corresponding cups to the chemical-liquid tank; and
a plurality of the branch pipes which correspond to the recovery pipes, respectively, and which guide the chemical liquid within the circulation pipe to the corresponding recovery pipes.

7. The substrate processing apparatus according to claim 6 further comprising:
a pressure gauge which measures a pressure in the circulation pipe;
a pressure-regulating valve which changes the pressure in the circulation pipe; and
a controller which is configured to change, based on a detection value of the pressure gauge, an opening degree of the pressure-regulating valve.

8. The substrate processing apparatus according to claim 1,
wherein the chemical liquid is BHF (a mixed solution containing HF, $NH_4F$, and $H_2O$).

9. The substrate processing apparatus according to claim 1, wherein
the recovery pipe is connected to the cup and the chemical-liquid tank, and
the chemical-liquid tank is connected to the supply pipe which supplies the chemical liquid to the chemical-liquid nozzle via the circulation pipe.

10. The substrate processing apparatus according to claim 1, wherein the branch pipe causes the chemical liquid in the recovery pipe to flow in the chemical-liquid tank by guiding the chemical liquid in the circulation pipe to the recovery pipe when the supply valve is in the closed state.

11. The substrate processing apparatus according to claim 1, wherein the branch valve is switched to the open state when the supply valve is switched to the closed state.

12. The substrate processing apparatus according to claim 11, wherein the branch valve is switched to the closed state when the supply valve is switched to the open state.

13. The substrate processing apparatus according to claim 1, wherein the recovery pipe is directly connected to the cup and the chemical-liquid tank.

14. The substrate processing apparatus according to claim 1, wherein the branch pipe is directly connected to the circulation pipe and the recovery pipe.

15. The substrate processing apparatus according to claim 1, wherein an upstream end of the branch pipe is connected to the circulation pipe at a position which is downstream of a position in which the supply pipe is connected to the circulation pipe.

* * * * *